US008698048B2

(12) United States Patent
Lerner et al.

(10) Patent No.: US 8,698,048 B2
(45) Date of Patent: *Apr. 15, 2014

(54) HIGH TEMPERATURE VACUUM CHUCK ASSEMBLY

(75) Inventors: Alexander N. Lerner, San Jose, CA (US); Blake Koelmel, Palo Alto, CA (US); Mehran Behdjat, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 13/456,455

(22) Filed: Apr. 26, 2012

(65) Prior Publication Data

US 2012/0205878 A1 Aug. 16, 2012

Related U.S. Application Data

(63) Continuation of application No. 12/014,535, filed on Jan. 15, 2008, now Pat. No. 8,198,567.

(51) Int. Cl.
*F27B 5/06* (2006.01)
*F27D 5/00* (2006.01)
*H01L 21/68* (2006.01)
*H01L 21/683* (2006.01)

(52) U.S. Cl.
USPC ........ 219/390; 219/392; 219/444.1; 118/728; 118/729

(58) Field of Classification Search
None
See application file for complete search history.

(56) References Cited

U.S. PATENT DOCUMENTS

| 4,609,037 | A | 9/1986 | Wheeler et al. |
| 4,842,683 | A | 6/1989 | Cheng et al. |
| 5,228,501 | A | 7/1993 | Tepman et al. |
| 5,348,497 | A | 9/1994 | Nitescu |
| 5,350,479 | A | 9/1994 | Collins et al. |
| 5,511,799 | A | 4/1996 | Davenport et al. |
| 5,522,937 | A | 6/1996 | Chew et al. |

(Continued)

FOREIGN PATENT DOCUMENTS

| EP | 0999575 A2 | 5/2000 |
| JP | 02-34449 | 12/1990 |

(Continued)

OTHER PUBLICATIONS

KR 10-2006-0122557, Vacuum Chuck, Lee, Nov. 30, 2006, machine translation.*

(Continued)

*Primary Examiner* — Joseph M Pelham
(74) *Attorney, Agent, or Firm* — Patterson & Sheridan, LLP

(57) ABSTRACT

A vacuum chuck and a process chamber equipped with the same are provided. The vacuum chuck assembly comprises a support body, a plurality of protrusions, a plurality of channels, at least one support member supporting the support body, at least one resilient member coupled with the support member, a hollow shaft supporting the support body, at least one electrical connector disposed through the hollow shaft, and an air-cooling apparatus. The support body has a support surface for holding a substrate (such as a wafer) thereon. The protrusions are formed on and project from the support surface for creating a gap between the substrate and the support surface. The channels are formed on the support surface for generating reduced pressure in the gap. The air-cooling apparatus is used for providing air cooling in the vicinity of the electrical connector.

20 Claims, 8 Drawing Sheets

(56) References Cited

U.S. PATENT DOCUMENTS

| | | | |
|---|---|---|---|
| 5,625,526 A | 4/1997 | Watanabe et al. | |
| 5,633,073 A | 5/1997 | Cheung et al. | |
| 5,656,093 A | 8/1997 | Burkhart et al. | |
| 5,673,167 A | 9/1997 | Davenport et al. | |
| 5,720,818 A | 2/1998 | Donde et al. | |
| 5,761,023 A | 6/1998 | Lue et al. | |
| 5,764,471 A | 6/1998 | Burkhart | |
| 5,968,379 A | 10/1999 | Zhao et al. | |
| 6,019,164 A | 2/2000 | Getchel et al. | |
| 6,019,166 A | 2/2000 | Viswanath et al. | |
| 6,066,836 A | 5/2000 | Chen et al. | |
| 6,072,685 A | 6/2000 | Herchen | |
| 6,118,100 A | 9/2000 | Mailho et al. | |
| 6,151,203 A | 11/2000 | Shamouilian et al. | |
| 6,413,321 B1 | 7/2002 | Kim et al. | |
| 6,423,949 B1 | 7/2002 | Chen et al. | |
| 6,464,795 B1 | 10/2002 | Sherstinsky et al. | |
| 6,518,548 B2 | 2/2003 | Kaneko et al. | |
| 6,534,751 B2 | 3/2003 | Uchiyama et al. | |
| 6,617,553 B2 | 9/2003 | Ho et al. | |
| 6,682,603 B2 | 1/2004 | Gondhalekar et al. | |
| 6,710,857 B2 | 3/2004 | Kondo | |
| 6,730,175 B2 | 5/2004 | Yudovsky et al. | |
| 6,853,533 B2 | 2/2005 | Parkhe | |
| 7,033,443 B2* | 4/2006 | Kellerman et al. | 118/724 |
| 7,078,651 B2 | 7/2006 | Jennings | |
| 7,361,865 B2 | 4/2008 | Maki et al. | |
| 7,718,925 B2 | 5/2010 | Goto et al. | |
| 7,927,096 B2 | 4/2011 | Fukumoto et al. | |
| 2001/0003334 A1 | 6/2001 | Kano et al. | |
| 2002/0189940 A1* | 12/2002 | Tsai et al. | 204/298.15 |
| 2003/0015517 A1 | 1/2003 | Fure et al. | |
| 2004/0163601 A1 | 8/2004 | Kadotani et al. | |
| 2004/0187788 A1 | 9/2004 | Kellerman et al. | |
| 2006/0054090 A1 | 3/2006 | Kurita et al. | |
| 2006/0096972 A1 | 5/2006 | Nakamura | |
| 2006/0130767 A1 | 6/2006 | Herchen | |
| 2006/0186109 A1 | 8/2006 | Goto et al. | |
| 2007/0131173 A1 | 6/2007 | Halpin et al. | |
| 2009/0031955 A1 | 2/2009 | Lu et al. | |

FOREIGN PATENT DOCUMENTS

| | | |
|---|---|---|
| JP | 07-099231 A | 4/1995 |
| JP | 2002-057209 | 2/2002 |
| JP | 2005-064329 A | 3/2005 |
| JP | 2006-121054 | 5/2006 |
| KR | 10-2006-0122557 | 11/2006 |

OTHER PUBLICATIONS

Notice of Reasons for Rejection dated Apr. 2, 2013 for Japanese Patent Application No. 2010-542317.

European Search Report dated Jul. 7, 2011 for European Patent Application No. 09701930.1.

First EPO Examination Report dated Aug. 23, 2011 for European Patent Application No. 09701930.1.

PCT International Search Report and Written Opinion dated Aug. 21, 2009 for International Application No. PCT/US2009/030263.

* cited by examiner

HIGH TEMPERATURE VACUUM CHUCK ASSEMBLY

CROSS-REFERENCE TO RELATED APPLICATIONS

This application is a continuation of co-pending U.S. patent application Ser. No. 12/014,535, filed Jan. 15, 2008, which is herein incorporated by reference in its entirety.

BACKGROUND OF THE INVENTION

1. Field of the Invention

Embodiments of the present invention generally relate to semiconductor manufacturing, and more particularly to a vacuum chuck assembly for use in a processing chamber.

2. Description of Related Art

In the manufacture of integrated circuits (ICs), substrates may be heated to high temperatures so that various chemical and/or physical reactions can take place. Thermal processes are usually used to heat the substrates. A typical thermal process, such as annealing, requires providing a relatively large amount of thermal energy to the substrate in a short amount of time, and thereafter rapidly cooling the wafer to terminate the thermal process. Examples of thermal processes currently in use include Rapid Thermal Processing (RTP), impulse (spike) annealing, scanning laser anneal techniques, and pulsed laser techniques. Heated vacuum chucks are generally used to secure substrates in process chambers during these thermal processes.

The planarity of the substrate surface is quite important throughout the manufacture of integrated circuits; especially during a pulsed laser anneal process such as a dynamic surface anneal (DSA) process. During a DSA process, a substrate is scanned with a line of radiation emitted by a laser in order to facilitate the annealing process. The depth of focus of the anneal laser is greatly influenced by several factors including the planarity of the wafer surface. Thus, the support surface of the vacuum chuck which holds the wafer has to be as planar as possible. It generally takes a lot of effort to planarize the whole support surface of the vacuum chuck for ensuring the planarity of the wafer surface. Additionally, the heated vacuum chuck is very likely to bow upwards as the center of the chuck heats up and the periphery of the chuck loses heat. The warped chuck may cause warpage of the wafer held thereon, thus greatly reducing the planarity of the wafer surface. Also, the electrical connectors coupled with the heated vacuum chuck may be damaged or melted by overheating in the process chamber.

Therefore, it is desirable to have a vacuum chuck assembly and a process chamber equipped with the vacuum chuck assembly for improving the aforementioned disadvantages of the vacuum chuck.

SUMMARY OF THE INVENTION

Embodiments of the present invention generally relate to semiconductor manufacturing, and more particularly to a vacuum chuck assembly for use in a processing chamber.

According to one embodiment of the invention, a vacuum chuck assembly comprising a support body having a support surface adapted to hold a substrate such as a wafer, at least one support member supporting the support body, and at least one resilient member coupled with the at least one support member is provided. During heating, when the support body bows upwards, the resilient member provides control force to pull the support body downwards and counteract the upward bowing of the chuck.

In another embodiment, the vacuum chuck assembly further comprises a support body having a support surface for holding a substrate thereon, a plurality of protrusions formed on the support surface, the protrusions projecting from the support surface for creating a gap between the substrate and the support surface, and a plurality of channels formed on the support surface for uniformly distributing reduced pressure along the back side of the substrate.

In another embodiment, the vacuum chuck assembly further comprises at least one electrical connector assembly disposed through a hollow shaft, wherein the electrical connector assembly comprises an electrical connector and a receptacle having one or more cooling channels for providing air cooling in the vicinity of the electrical connector to prevent overheating of the electrical connector.

In another embodiment, a process chamber equipped with a vacuum chuck assembly is provided. The process chamber comprises a chamber mount, a support body having a support surface for holding a substrate thereon, a plurality of protrusions formed on the support surface, the protrusions projecting from the support surface for creating a gap between the substrate and the support surface, wherein each of the protrusions has a planarized top surface for contacting the substrate, a plurality of channels formed on the support surface for uniformly distributing pressure along the back side of the substrate, at least one support member supporting the support body, and at least one resilient member coupled between the chamber mount and the at least one support member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention are generally related to a resilient member used to compensate for bowing of a support body as a result of heating, thus ensuring the planarity of the support surface. Embodiments of the present invention further comprise an electrical connector assembly that uses air-cooling to prevent the electrical connectors from overheating and melting during the annealing process. Embodiments of the present invention further comprise a plurality of protrusions formed on a support surface of a support body for reducing the surface contact area between the support surface and a substrate (such as a wafer) thus ensuring the planarity of the substrate and improving the depth of focus of an anneal laser.

The invention will be described below in relation to a laser surface anneal chamber. However, a variety of processing chambers, including other types of chambers that operate at high temperatures may benefit from the teachings disclosed herein, and in particular, processing chambers that use lasers as a means for annealing which may be a part of a semiconductor wafer processing system such as the CENTURA® system which is available from Applied Materials, Inc., of Santa Clara, Calif. It is contemplated that other processing chambers, including those available from other manufacturers, may be adapted to benefit from the invention.

Figure 1:
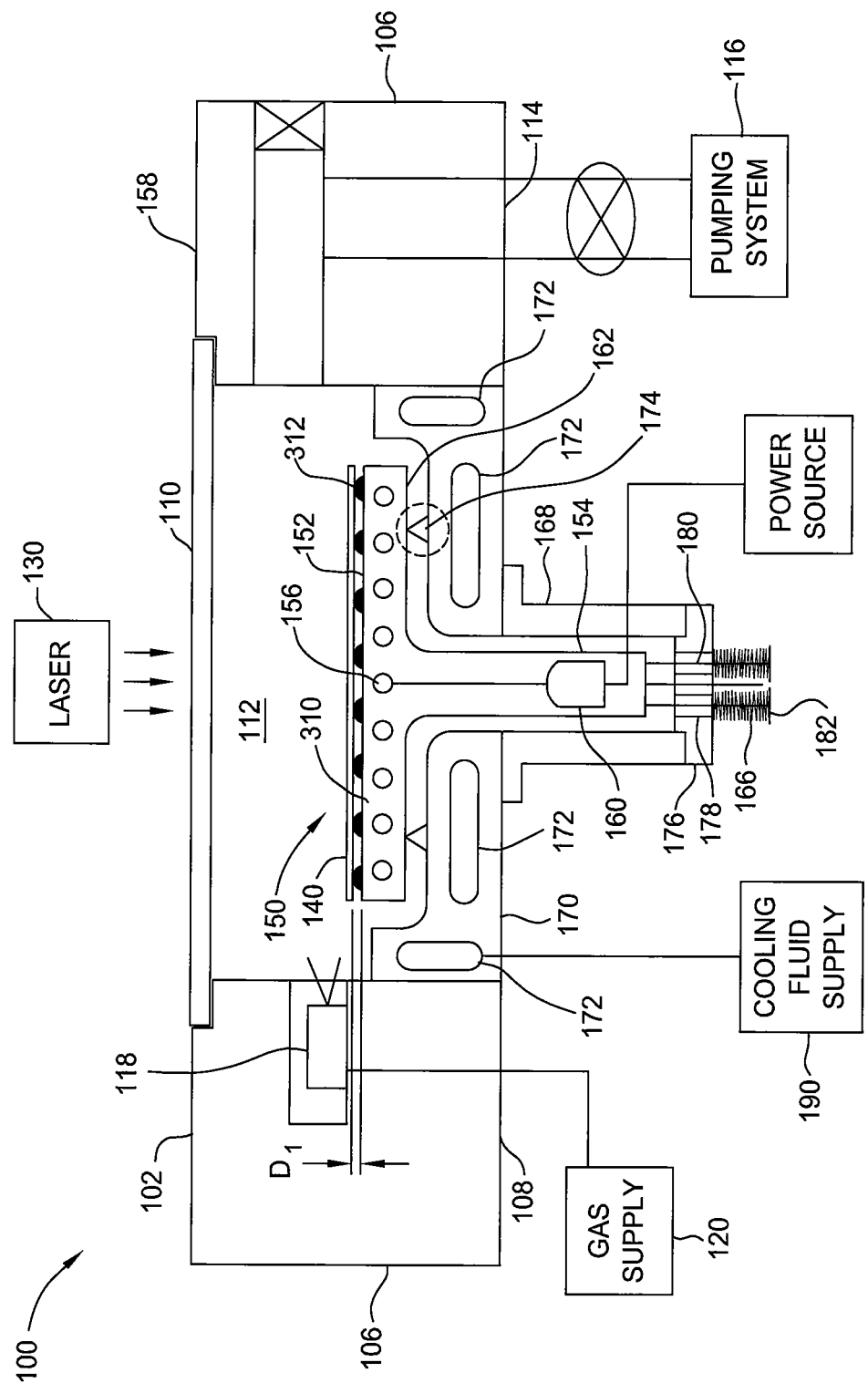
FIG. 1 schematically illustrates a cross-sectional view of a process chamber with a vacuum chuck assembly in accordance with one embodiment of the present invention.
Figure 2:
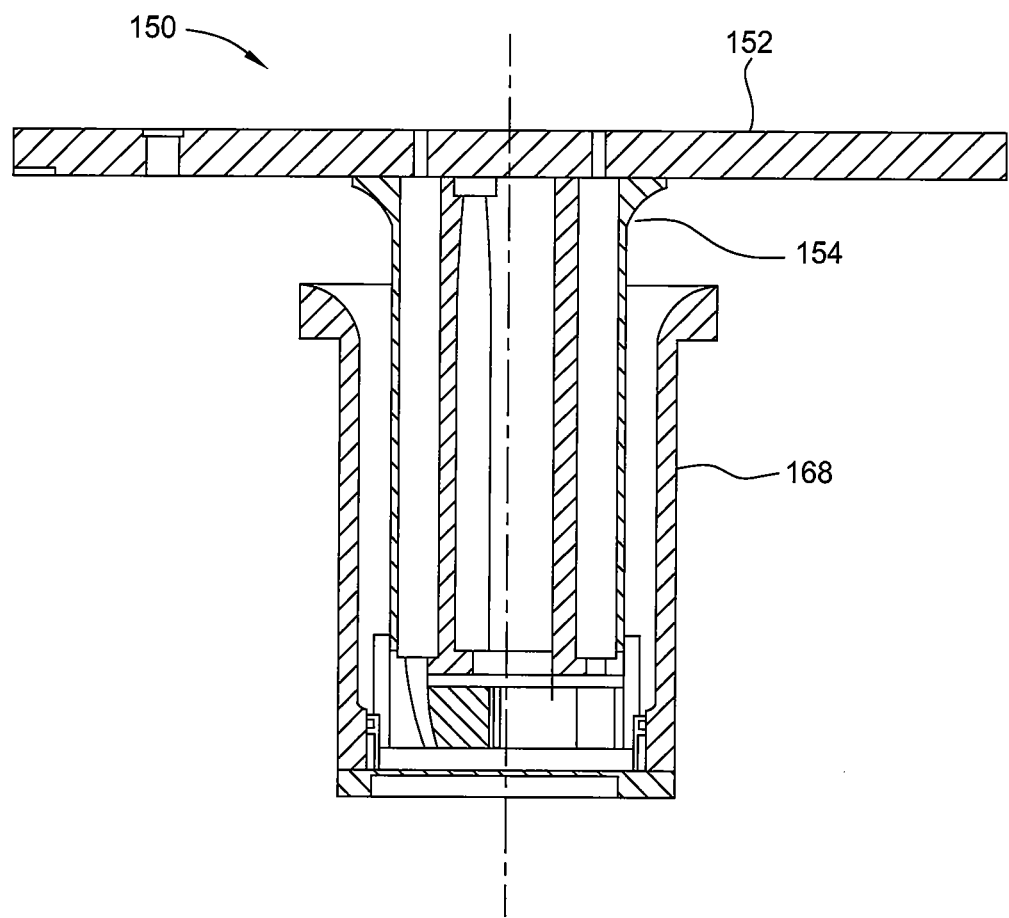
FIG. 2 schematically illustrates a cross-sectional view of a vacuum chuck assembly in accordance with one embodiment of the present invention.

With reference to FIG. 1 and FIG. 2, FIG. 1 schematically illustrates a cross-sectional view of a process chamber 100 with a vacuum chuck assembly 150 in accordance with one embodiment of the present invention and FIG. 2 schematically illustrates a cross-sectional view of a vacuum chuck assembly 150 in accordance with one embodiment of the present invention. The vacuum chuck assembly 150 facilitates improved substrate processing by maintaining planarity of the substrate.

In one embodiment, the process chamber 100 is a laser anneal chamber. The process chamber 100 comprises a chamber body 102. The chamber body 102 has sidewalls 106, a bottom 108, and a window 110 that define a process volume 112. The process volume 112 is typically accessed through a slit valve 158 in the sidewall 106 that facilitates movement of a substrate 140 (hereinafter referred to as substrate 140) into and out of the chamber body 102. In certain embodiments, the substrate 140 may be a wafer, such as a wafer used in semiconductor processing. The sidewalls 106 and bottom 108 of the chamber body 102 are generally fabricated from a unitary block of aluminum or other material compatible with process chemistries. The bottom 108 of the chamber 100 comprises a support piece 170 having one or more cooling channels 172 formed within the support piece 170. The one or more cooling channels 172 are coupled with a cooling fluid supply 190 configured to provide a cooling liquid or gas to the one or more cooling channels 172. The support piece 170 may comprise stainless steel. In one embodiment, the support piece 170 has an optically reflective surface facing the backside of the substrate to enhance emissivity. One or more support pins 174 are coupled with and extend above the surface of the support piece 170. The bottom 108 of the chamber 100 has a pumping port 114 formed therethrough that couples a process volume 112 to a pumping system 116 to facilitate control of pressure within the process volume 112 and exhaust gases and byproducts during processing.

The window 110 is supported by the sidewalls 106 of the chamber body 102 and can be removed to service the interior of the chamber 100. In one embodiment, the window 110 comprises a material such as quartz.

Process gas and other gases may be introduced into the process volume 112 from a gas source 118 coupled with a gas supply 120. In one embodiment, the gas source 118 is positioned so as to provide a uniform flow of gases across the surface of the substrate 140. In one embodiment, the gas source is positioned in the sidewall 106.

A laser 130 is located above the window 110. Lasers that may be used with the embodiments described herein are further described in commonly assigned U.S. patent application Ser. No. 10/126,419, filed Apr. 18, 2002, issued as U.S. Pat. No. 7,078,651, entitled "Thermal Flux Process by Scanning," which is incorporated by reference herein. In one embodiment, the laser 110 may be coupled with a translation mechanism adapted to move the laser 110 across the surface of the substrate 140.

The vacuum chuck assembly 150 is centrally disposed within the chamber body 102 and supports the substrate 140 during processing. The vacuum chuck assembly 150 generally includes a support body 152 supported by a shaft 154 that extends through the chamber bottom 108. The support body 152 is generally circular in shape and may be fabricated from materials such as quartz, ceramics such as alumina, or combinations thereof. In one embodiment, the support body 152 encapsulates at least one embedded heating element 156. The heating element 156, such as an electrode or resistive heating element, is coupled with a power source via electrical connector assembly 160 and controllably heats the support body 152 and substrate 140 positioned thereon to a predetermined temperature. In one embodiment, the heating element 156 heats the substrate 140 to a temperature of between about 20° C. and 750° C. during processing.

Figure 3:
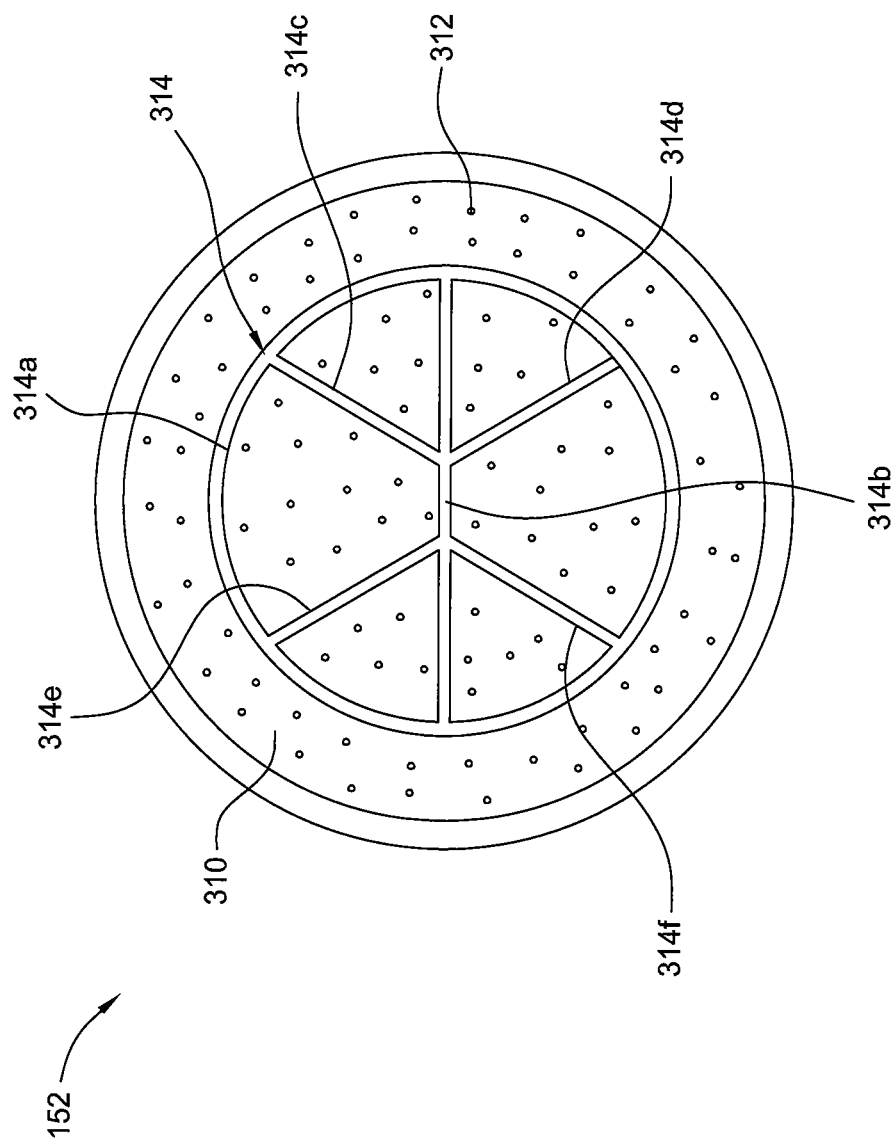
FIG. 3 schematically illustrates a top view of a vacuum chuck assembly in accordance with one embodiment of the present invention.

FIG. 3 schematically illustrates a top view of a vacuum chuck assembly in accordance with one embodiment of the present invention. The support body 152 has an upper surface or support surface 310 for supporting the substrate 140 thereon. A plurality of protrusions 312 are formed on the support surface 310 upon which the substrate 140 may rest during processing.

In one embodiment, all of the protrusions 312 are formed with the same height and have planarized top surfaces to contact the backside of the substrate 140, and the sum of the top surface areas of the protrusions 312 is significantly smaller than the support surface 310, thereby reducing the contact area between the support body 152 and the substrate 140. With the smaller contact area between the support body 152 and the substrate 140, this embodiment merely needs to bring the protrusions to planarity instead of planarizing the whole support surface 310 as done in the conventional vacuum chuck, thus simplifying planarization of the support surface 310. Further, the smaller contact area therebetween can reduce the possibility of particle contamination caused by the support surface 310 of the support body 152. In one embodiment, the height of the protrusions 312 may be from about 10 microns to about 50 microns, for example, about 25 microns, and the width or diameter of the protrusions 312 may be from about 500 microns to about 5000 microns. In one embodiment, the plurality of protrusions 312 and the support surface 310 are unitary and may be formed by, for example, either machining or bead blasting the surface of the support body 152. In another embodiment, the plurality of protrusions 312 are formed separately and coupled with the support surface 310 using attachment techniques known in the art such as brazing or bonding with adhesives. In another embodiment, the protrusions may be deposited on the support surface using a deposition process and a mask pattern. In one embodiment, the support surface 310 is 300 mm in diameter and has between 100 and 500 protrusions, for example, between 150 and 200 protrusions that occupy approximately 10% of the back side surface area of the substrate placed thereon. In one embodiment the protrusions 312 are arranged in a substantially linear arrangement across the support surface 310. In another embodiment, the protrusions 312 are arranged in a radial pattern emanating from the center of the support surface. In another embodiment, the protrusions are arranged in an x-y grid pattern across the support surface 310. In one embodiment, the support surface 310 is 200 mm in diameter. Although shown as circular, it should be understood that the support surface 310 may comprise other shapes such as squares or rectangles.

Figure 4A:
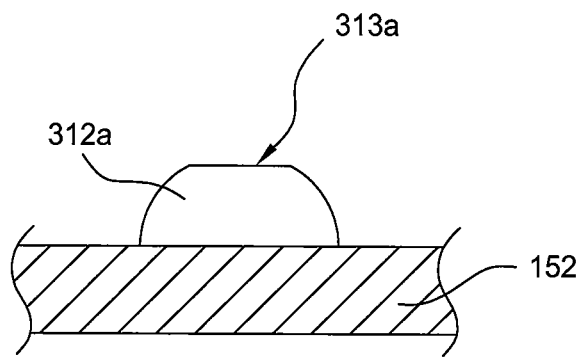
FIGS. 4A-4C schematically illustrate an exemplary shape of a protrusion in accordance with one embodiment of the present invention.
Figure 4B:
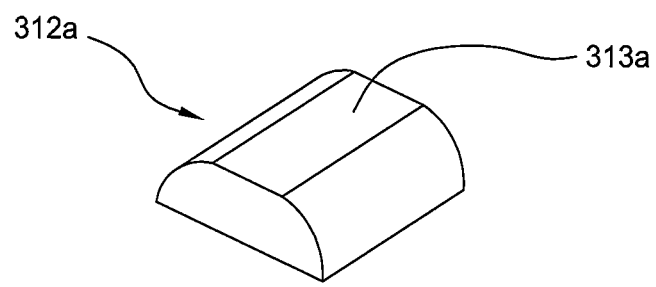
Figure 4C:
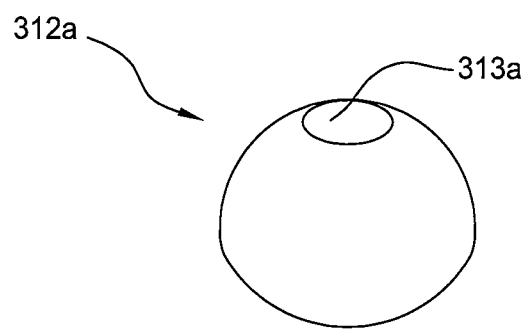
Figure 5A:
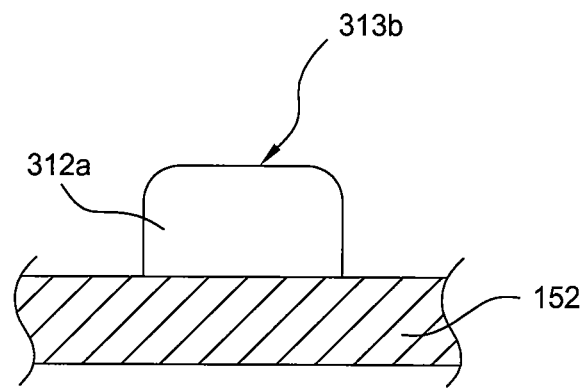
FIGS. 5A-5B schematically illustrate another exemplary shape of a protrusion in accordance with one embodiment of the present invention.
Figure 5B:
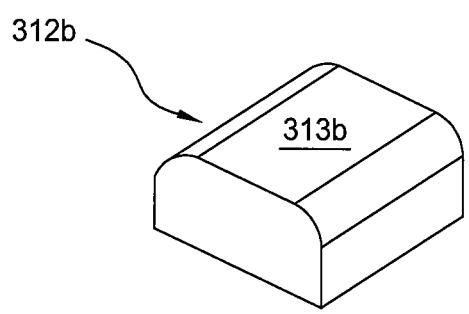

FIGS. 4A-4C; FIG. 5A, and FIG. 5B illustrate the exemplary shapes of the protrusions applicable to embodiments of the present invention. For preventing the scratching of the substrate, the shape of the protrusion can be such as a hemispherical-like protrusion 312a with a planarized top surface 313a shown in FIG. 4A, which can be formed on a circular square foundation as shown in FIG. 4B or on a circular foundation as shown in FIG. 4C; or can be a square foundation with a rounded top surface, such as a protrusion 312b with a planarized top surface 313b as shown in FIG. 5A and FIG. 5B. The shapes, size and pattern of the protrusions described above are merely stated as examples, and the present invention is not limited thereto. The plurality of protrusions 312 may comprise cylindrical mounds, posts, pyramids, cones, rectangular blocks, protrusions of varying sizes, any other shape that will improve the depth of focus during a laser anneal process, or combinations thereof.

Returning to FIG. 1 and FIG. 3, the protrusions 312 create a gap D1 between the substrate 140 and the support surface 310 of the support body 152. In one embodiment, a plurality of channels 314 are formed on the support surface 310, and are connected to a vacuum pump (not shown), thereby generating reduced pressure in the gap D1 to secure the substrate 140 on the support body 152. The channels 314 are preferably formed in a symmetrical pattern for exerting uniform suction force on the substrate 140. As shown in FIG. 3, the channels 314 can be formed in a pattern composed of a circular channel 314a, a straight channel 314b, and two pairs of slanting channels 314c/314d and 314e/314f. The straight channel 314b is formed diametrically in the circular channel 314a, and the pairs of slanting channels 314c/314d and 314e/314f extend respectively from the straight channel 314b and are mirror-reflected to each other. The channel pattern described herein is merely stated as an example, and the present invention is not limited thereto.

Returning to FIG. 1, the lower surface 162 of the support body 152 is supported by the one or more support pins 174. Generally, the shaft 154 extends from the lower surface 162 of the support body 152 through the chamber bottom 108 and couples the support body 152 to a resilient member 166 adapted to exert a downward force on the support body 152. A sleeve 168 circumscribes a portion of the shaft 154. In one embodiment, the sleeve 168 is coupled with the bottom of support piece 170. The bottom of the sleeve 168 is coupled with a base 176. The base 176 has one or more holes 178 through which one or more posts 180 extend. The one or more posts 180 are positioned between the bottom of the shaft 154 and a chamber mount 182. The resilient member 166 is coupled between the chamber mount 182 and the support body 152. The resilient member 166 may comprise a spring device such as a leaf spring, compression spring, flat spring, or conical spring but can also be any resilient or bendable wire providing the desired characteristics. When the support body 152 bows upwards as a result of heating, the resilient member 166 provides a control force to pull the support body 152 downwards, thereby preventing the support body 152 from warping, thus further ensuring the planarity of the substrate 140.

Figure 6:
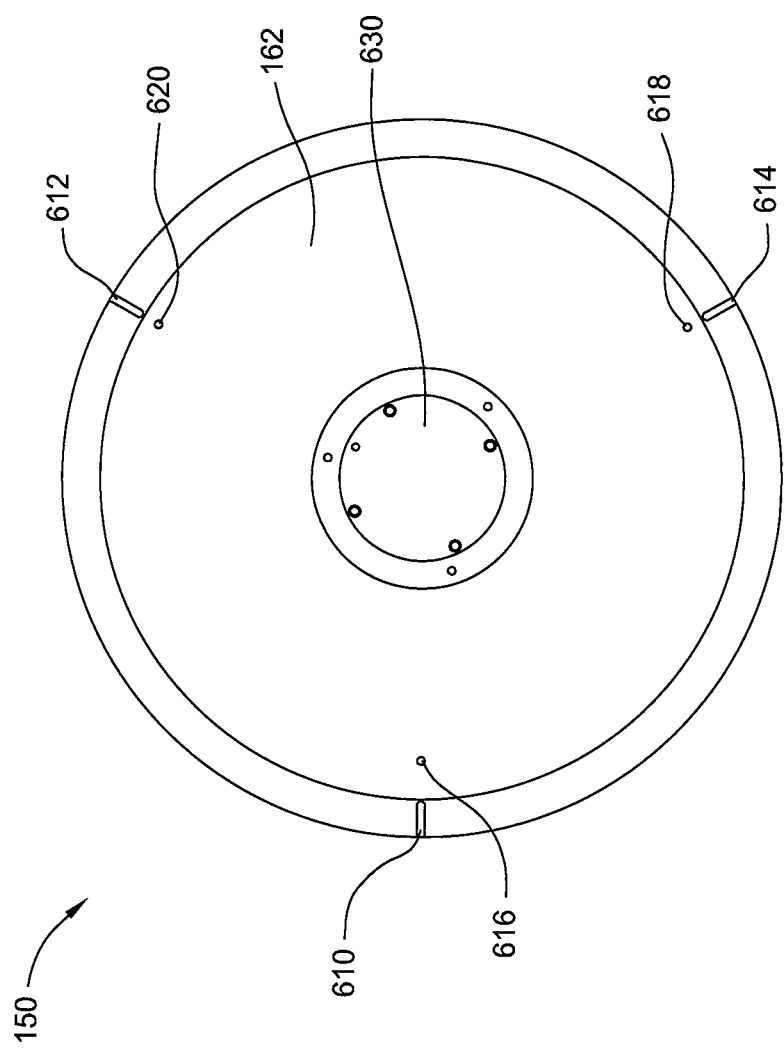
FIG. 6 schematically illustrates a bottom view of a vacuum chuck assembly in accordance with one embodiment of the present invention.
Figure 7:
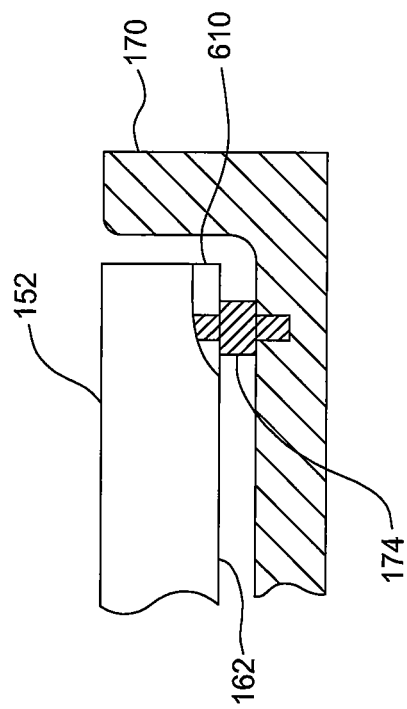
FIG. 7 is an enlarged partial cross-sectional view of the vacuum chuck assembly of FIG. 1 in accordance with one embodiment of the present invention.

With reference to FIG. 6 and FIG. 7, FIG. 6 illustrates a bottom view of a vacuum chuck assembly in accordance with one embodiment of the present invention and FIG. 7 is an enlarged partial cross-sectional view of the process chamber 100 and the vacuum chuck assembly 150 of FIG. 1 in accordance with one embodiment of the present invention. The lower surface 162 of the vacuum chuck assembly 150 has one or more slots adapted to engage the one or more support pins 174. In one embodiment, the lower surface 162 has three slots 610, 612, 614 each configured to engage a separate support pin 174. Although three slots 610, 612, 614 are shown for engaging three support pins 174, it should be understood that any number of slots and support pins sufficient for supporting the support body 152 may be used. When the resilient member 166 provides control force to pull the support body 152 downwards, thereby reducing warping of the support body 152, the support pins 174 provide an upward force against the support body 152. Through bores 616, 618, 620 are provided through support body 152 to enable substrate lift pins (not shown) to pass through the support body 152 to raise and lower substrates onto the support surface 310. An insert region 630 is provided at the center of lower surface 162 of the support body 152. The insert region 630 may be used for temperature monitoring devices such as thermocouples and power devices such as electrical connectors.

Figure 8B:
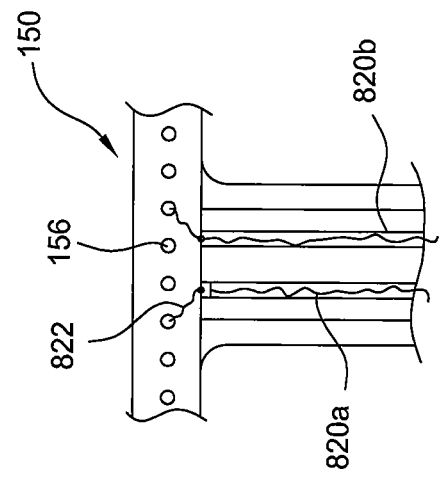
FIG. 8B schematically illustrates a partial cross-sectional view of a vacuum chuck assembly with a heating element in accordance with one embodiment of the present invention.
Figure 8A:
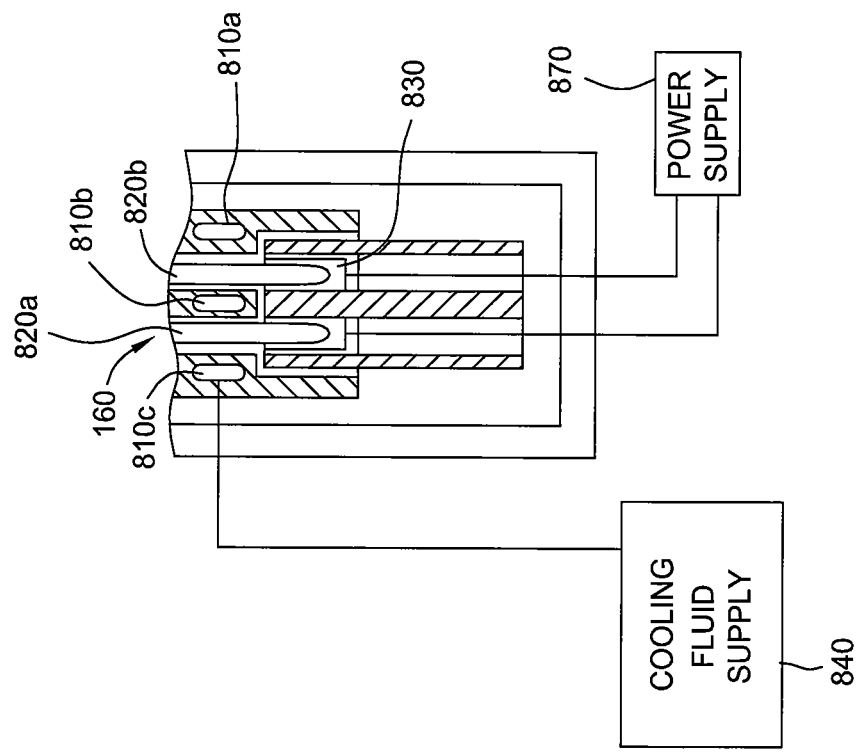
FIG. 8A schematically illustrates a cross-sectional view of an electrical connector in accordance with one embodiment of the present invention.

FIG. 8A is a cross-sectional view of an electrical connector in accordance with one embodiment of the present invention and FIG. 8B is a partial cross-sectional view of a vacuum chuck assembly with a heating element in accordance with one embodiment of the present invention. In one embodiment, the vacuum chuck assembly 150 further comprises at least one electrical connector assembly 160 comprising one or more electrical connectors 820a, 820b and a receptacle 830 having one or more cooling channels 810a, 810b, 810c formed therein. The electrical connector assembly 160 is disposed through the shaft 154 for supplying power to the chuck assembly 150. The one or more cooling channels 810a, 810b, 810c may be used to establish an air path thereby providing air cooling in the vicinity of the electrical connector assembly 160, thus preventing the electrical connector assembly 160 from overheating or melting during heating.

The electrical connector assembly 160 comprises male connector members 820a, 820b generally coupled with an electrode connector 822 which is coupled with the heating element 156 for supplying power to the heating element 156. Electrical connector assembly 160 has a complimentary receptacle 830 for receiving male connector members 820a, 820b. The complimentary receptacle 830 may comprise a female banana connector for receiving the male pin connector members 820a, 820b which may be a complimentary resilient banana connector. In one embodiment, the one or more cooling channels 810 are located adjacent to the male pin connectors 820a, 820b. The one or more cooling channels 810a, 810b, 810c are coupled with a cooling fluid supply 840. The fluid cooling supply 840 comprises a cooling fluid such as air, water, glycol or combinations thereof. The electrical connector assembly 160 is coupled with a power supply 870.

According to the forgoing embodiments, the present invention has the advantages of simplifying planarization of a chuck support surface by merely planarizing the protrusion top surfaces; reducing particle contamination by reducing the surface contact area between the support body surface and a substrate; improving the depth of focus of anneal laser by ensuring the planarity of the support surface via the setup of protrusions and spring system; and preventing electrical connectors from overheating or melting via air-cooling.

While the foregoing is directed to embodiments of the present invention, other and further embodiments of the invention may be devised without departing from the basic scope thereof, and the scope thereof is determined by the claims that follow.

What is claimed is:

1. A vacuum chuck assembly, comprising:
    a support body having a support surface for holding a substrate thereon;
    a plurality of protrusions formed on the support surface, the protrusions projecting from the support surface for creating a gap between the substrate and the support surface;
    a plurality of channels formed on the support surface, wherein the plurality of channels are formed in a symmetrical pattern for exerting uniform suction force on the substrate;
    a shaft supporting the support body; and
    at least one resilient member coupled with the shaft, wherein the at least one resilient member is adapted to exert a downward force on the support body.

2. The vacuum chuck assembly of claim 1, wherein the plurality of channels are formed in a pattern composed of:
    a circular channel;
    a diametrically straight channel formed within the circular channel; and
    two pairs of straight channels, each extending from the diametrically straight channel so as to form an acute angle, wherein the pairs of straight channels are mirror-reflected to each other.

3. The vacuum chuck assembly of claim 2, wherein the plurality of channels are formed on the support surface are connected with a vacuum pump for generating reduced pressure in the gap to secure the substrate to the support body.

4. The vacuum chuck assembly of claim 2, wherein the protrusions are 25 micron protrusions.

5. The vacuum chuck assembly of claim 2, wherein the protrusions are unitary with the support surface.

6. The vacuum chuck assembly of claim 2, wherein each of the protrusions has a planarized top surface for contacting the substrate.

7. The vacuum chuck assembly of claim 6, wherein the planarized top surface is rounded.

8. The vacuum chuck assembly of claim 1, wherein the resilient member comprises a spring device.

9. The vacuum chuck assembly of claim 8, wherein the resilient member is selected from the group consisting of: a leaf spring, a compression spring, a flat spring or a conical spring.

10. A vacuum chuck assembly, comprising:
    a support body having a support surface for holding a substrate thereon;
    a plurality of protrusions formed on the support surface, the protrusions projecting from the support surface for creating a gap between the substrate and the support surface;
    a plurality of channels formed on the support surface, wherein the plurality of channels are formed in a symmetrical pattern for exerting uniform suction force on the substrate;
    a shaft supporting the support body; and
    at least one resilient member coupled with the shaft, wherein the at least one resilient member provides control force to pull the support body downwards when the support body bows upwards as a result of heating.

11. A process chamber, comprising:
    a chamber body having sidewalls and a bottom, wherein the bottom comprises a support piece having:
        one or more support pins coupled with and extending above a surface of the support piece
    a chamber mount;
    a vacuum chuck assembly disposed within the chamber body, comprising:
        a support body having a support surface for holding a substrate thereon;
        a plurality of protrusions formed on the support surface, the protrusions projecting from the support surface for creating a gap between the substrate and the support surface, wherein each of the protrusions has a planarized top surface for contacting the substrate;
        a shaft extending through the chamber bottom supporting the support body; and
        at least one resilient member coupled between the chamber mount and the shaft, wherein the at least one resilient member is disposed below the shaft and the at least one resilient member provides control force to pull the support body downwards when the support body bows upwards as a result of heating.

12. The process chamber of claim 11, wherein a lower surface of the support body has one or more slots adapted to engage the one or more support pins.

13. The process chamber of claim 12, wherein the resilient member provides a control force to pull the support body downward and the support pins provide an upward force against the support body.

14. The process chamber of claim 11, wherein the support piece has one or more cooling channels coupled with a cooling fluid supply configured to provide a cooling liquid or gas to the one or more cooling channels.

15. The process chamber of claim 14, wherein the support piece has an optically reflective surface facing the backside of the substrate to enhance emissivity.

16. The process chamber of claim 11, further comprising a plurality of channels formed on the support surface, wherein the plurality of channels are formed in a symmetrical pattern for exerting uniform suction force on the substrate.

17. The process chamber of claim 11, further comprising a plurality of channels formed on the support surface, wherein the plurality of channels are formed in a symmetrical pattern for exerting uniform suction force on the substrate.

18. The process chamber of claim 17, wherein the plurality of channels are formed in a pattern composed of:
    a circular channel;
    a diametrically straight channel formed within the circular channel; and
    two pairs of straight channels, each extending from the diametrically straight channel so as to form an acute angle, wherein the pairs of straight channels are mirror-reflected to each other.

19. The process chamber of claim 18, wherein the plurality of channels are formed on the support surface are connected with a vacuum pump for generating reduced pressure in the gap to secure the substrate to the support body.

20. The process chamber of claim 11, further comprising:
at least one electrical connector assembly disposed through the hollow shaft, wherein the at least one electrical connector assembly has cooling channels disposed therein.

* * * * *

UNITED STATES PATENT AND TRADEMARK OFFICE
CERTIFICATE OF CORRECTION

PATENT NO.        : 8,698,048 B2            Page 1 of 1
APPLICATION NO.   : 13/456455
DATED             : April 15, 2014
INVENTOR(S)       : Lerner et al.

It is certified that error appears in the above-identified patent and that said Letters Patent is hereby corrected as shown below:

On the Title Page, Inventors Item (75):

Please delete "Palo Alto" and insert -- Mountain View -- therefor;

In the Specification:

In Detailed Description:

Column 5, Line 26, please delete "circular".

Signed and Sealed this
Twenty-ninth Day of July, 2014

Michelle K. Lee
*Deputy Director of the United States Patent and Trademark Office*